(12) United States Patent
Chang

(10) Patent No.: US 8,248,795 B2
(45) Date of Patent: Aug. 21, 2012

(54) DATA CENTER AND SERVER MODULE OF THE SAME

(75) Inventor: Yao-Ting Chang, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 171 days.

(21) Appl. No.: 12/871,852

(22) Filed: Aug. 30, 2010

(65) Prior Publication Data
US 2012/0020014 A1    Jan. 26, 2012

(30) Foreign Application Priority Data
Jul. 22, 2010   (TW) ................................ 99124088 A

(51) Int. Cl.
*H05K 7/20* (2006.01)

(52) U.S. Cl. ......... 361/695; 361/690; 361/694; 454/184

(58) Field of Classification Search ........................ None
See application file for complete search history.

(56) References Cited

U.S. PATENT DOCUMENTS

| | | | |
|---|---|---|---|
| 5,505,533 A * | 4/1996 | Kammersqard et al. | 312/236 |
| 7,525,797 B2 * | 4/2009 | Coglitore et al. | 361/679.46 |
| 7,916,470 B2 * | 3/2011 | Mills et al. | 361/679.49 |
| 7,961,463 B2 * | 6/2011 | Belady et al. | 361/695 |

* cited by examiner

*Primary Examiner* — Boris Chervinsky
(74) *Attorney, Agent, or Firm* — Altis Law Group, Inc.

(57) ABSTRACT

A data center includes a server module. The server module includes a housing, and a number of heat-generating elements arranged in the housing. The housing includes a front wall, a back wall, and left and right sidewalls. When the server module runs, cool air comes into the housing through the front wall and the back wall, for cooling the heat elements, then the heated air in the housing is vented out of the housing through the left and right sidewalls by a number of fans.

4 Claims, 1 Drawing Sheet

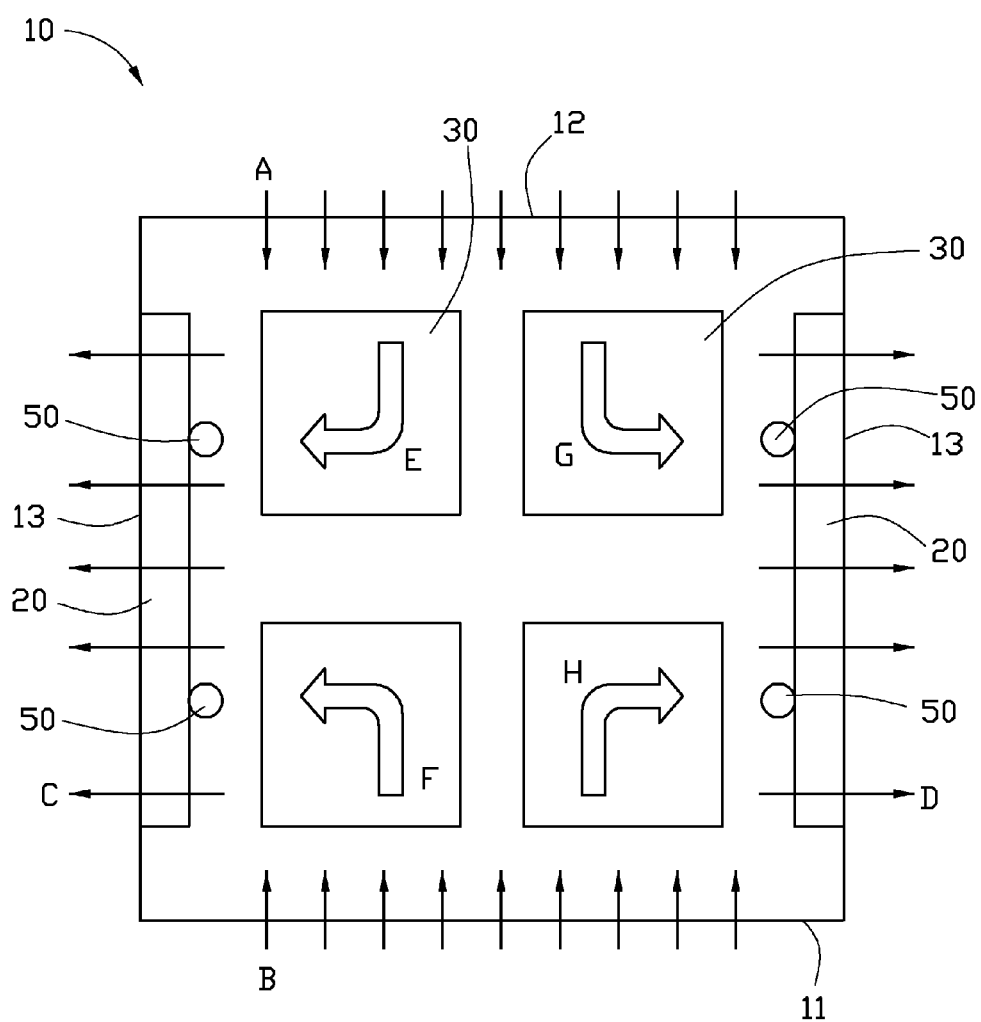

DATA CENTER AND SERVER MODULE OF THE SAME

BACKGROUND

1. Technical Field

The present disclosure relates to a data center and a server module of the data center.

2. Description of Related Art

A data center usually includes a number of server modules arranged in a housing of the data center. The airflow for heat dissipating generally comes from a front side of the server modules, and exhausts from a back side of the server modules. However, the route of the airflow is often too long to weaken the heat dissipation effect.

BRIEF DESCRIPTION OF THE DRAWING

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

The FIGURE is a sketch view of an embodiment of a server module of a data center.

DETAILED DESCRIPTION

The disclosure, including the accompanying drawing, is illustrated by way of examples and not by way of limitation. It should be noted that references to "an" or "one" embodiment in this disclosure are not necessarily to the same embodiment, and such references mean at least one.

Referring to the figure, an exemplary embodiment of a server module of a data center includes a housing 10. The housing 10 includes a front wall 11, a back wall 12 substantially parallel to the front wall 11, and left and right sidewalls 13 connected between the front wall 11 and the back wall 12. The front wall 11 and the back wall 12 define a number of through holes. The left and right sidewalls 13 define a number of vents. A number of fans 20 are mounted in the housing 10, substantially adjacent to and aligning with the vents of the left and right sidewalls 13. A number of heat elements 30, such as central processing units (CPU), peripheral component interconnect (PCI) cards, and data storage devices, are arranged in the housing 10.

When the server module runs, cool air comes into the housing 10 through the through holes of the front wall 11 and the back wall 12, for cooling the heat elements 30. The heated air in the housing 10 is then vented out of the housing 10 through the vents of the left and right sidewalls 13 by the fans 20. The airflow in the housing 10 is sketched as direction of arrows E, F, G, and H. As a result, the routes of the airflow in the present disclosure are shorter, compared with conventional airflow routes, for efficient heat dissipating.

Furthermore, a number of temperature sensing elements 50 are arranged in the housing 10 adjacent to the fans 20, for sensing the temperature of the airflow near the fans 20, to control the rotation speed of the fans 20.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. A data center comprising:
   a server module comprising a housing, and a plurality of heat-generating elements arranged in the housing;
   wherein the housing comprises a front wall, a back wall, and left and right sidewalls, the front wall and the back wall define a plurality of through holes, the left and right sidewalls define a plurality of vents, a plurality of fans is arranged in the housing adjacent to and aligning with the vents; and
   wherein when the server module runs, air comes into the housing through the through holes of the front wall and the back wall for cooling the heat elements, then the air in the housing is vented out of the housing through the vents of the left and right sidewalls by the fans.

2. The data center of claim 1, wherein a plurality of temperature sensing elements are arranged in the housing adjacent to the fans, for sensing the temperature of the airflow near the fans.

3. A server module comprising:
   a housing comprising a front wall, a back wall, and left and right walls connected between the front wall and the back wall, the front wall and the back wall defining a plurality of through holes, the left and right sidewalls defining a plurality of vents;
   a plurality of heat-generating elements arranged in the housing; and
   a plurality of fans arranged in the housing, adjacent to and aligning with the vents;
   wherein when the server module runs, air comes into the housing through the through holes of the front wall and the back wall for cooling the heat elements, then the air in the housing is vented out of the housing through the vents of the left and right sidewalls by the fans.

4. The server module of claim 3, further comprising a plurality of temperature sensing elements arranged in the housing adjacent to the fans, for sensing the temperature of the airflow near the fans.

* * * * *